(12) United States Patent
Anzou et al.

(10) Patent No.: US 8,599,632 B2
(45) Date of Patent: Dec. 3, 2013

(54) SEMICONDUCTOR INTEGRATED CIRCUIT

(75) Inventors: Kenichi Anzou, Kawasaki (JP);
Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 13/411,303

(22) Filed: Mar. 2, 2012

(65) Prior Publication Data

US 2013/0070545 A1 Mar. 21, 2013

(30) Foreign Application Priority Data

Sep. 16, 2011 (JP) ................................. 2011-203073

(51) Int. Cl.
*G11C 7/00* (2006.01)
(52) U.S. Cl.
USPC .......................................... 365/201; 365/200
(58) Field of Classification Search
USPC .......... 365/201, 200, 230.03, 230.01, 230.06, 365/230.05, 230.08, 233.11, 233.12, 365/233.16, 233.17, 233.19
See application file for complete search history.

(56) References Cited

U.S. PATENT DOCUMENTS

| | | | |
|---|---|---|---|
| 8,037,376 B2 | 10/2011 | Anzou et al. | |
| 2001/0056557 A1* | 12/2001 | Kawagoe et al. | 714/723 |
| 2004/0213058 A1* | 10/2004 | Shimizu et al. | 365/200 |
| 2005/0193293 A1* | 9/2005 | Shikata | 714/718 |
| 2010/0125766 A1 | 5/2010 | Anzou et al. | |
| 2011/0058434 A1 | 3/2011 | Anzou et al. | |

FOREIGN PATENT DOCUMENTS

| | | |
|---|---|---|
| JP | 2006-277821 | 10/2006 |
| JP | 2007-257698 | 10/2007 |
| JP | 2009-163790 | 7/2009 |
| JP | 2010-123159 | 6/2010 |

OTHER PUBLICATIONS

Background Art Information Sheet, with Concise Explanation of Japanese Reference No. 4 (JP 2006-277821), undated, in 1 page.

* cited by examiner

*Primary Examiner* — Harry W Byrne
*Assistant Examiner* — Hien Nguyen
(74) *Attorney, Agent, or Firm* — Knobbe, Martens Olson & Bear LLP

(57) ABSTRACT

The built-in self-test (BIST) circuit includes an address generating circuit. The BIST circuit includes a data generating circuit. The BIST circuit includes a chip enable signal generating circuit. The BIST circuit includes a control signal generating circuit. The memory block circuit includes the multiple memories. The memory block circuit includes an address converting circuit that generates, based on the address signal, an address input signal corresponding to the address of the memory to be tested out of the multiple memories, and generates a memory selection signal for selecting the memory to be tested from the multiple memories. The memory block circuit includes a memory output selecting circuit that selects and outputs data from the memory to be tested out of the multiple memories, based on the memory selection signal.

20 Claims, 5 Drawing Sheets

SEMICONDUCTOR INTEGRATED CIRCUIT

CROSS-REFERENCE TO RELATED APPLICATION

This application is based upon and claims the benefit of priority from the prior Japanese Patent Application No. 2011-203073, filed on Sep. 16, 2011; the entire contents of which are incorporated herein by reference.

BACKGROUND

1. Field

Embodiments described herein relate generally to a semiconductor integrated circuit.

2. Background Art

In a conventional method of detecting failures in a manufacturing test, a built-in self-test (BIST) circuit is incorporated into a memory device mounted in a semiconductor integrated circuit.

Such failure detection methods include a comparator-type BIST in which written data and read data are compared to each other to decide the presence or absence of failures and a compressor-type BIST in which read results are compressed in a BIST circuit to decide the presence or absence of failures based on compression results.

Generally, multiple BIST circuits are mounted on a semiconductor integrated circuit and each of the BIST circuits conducts a test on multiple memories. When the multiple memories are tested by a single BIST circuit during testing, the memories are tested in parallel or one by one.

In a configuration for testing all memories in parallel, unfortunately, an additional analysis circuit needs to be provided on each of the outputs of the memories, which leads to a larger circuit size.

In a configuration for testing memories one by one, the memories cannot be all simultaneously tested. Thus, the total testing time is the sum of the testing times of the target memories.

Therefore, these configurations are disadvantageous for LSI manufacturing and testing.

DETAILED DESCRIPTION

A semiconductor integrated circuit according to an embodiment includes a BIST circuit that conducts a test on a memory. The semiconductor integrated circuit includes a memory block circuit that combines multiple memories into a block. The BIST circuit includes an address generating circuit that generates an address signal containing an address of the memory. The BIST circuit includes a data generating circuit that generates data written into the memory and expected value data corresponding to the written data. The BIST circuit includes a chip enable signal generating circuit that generates a chip enable signal for controlling the memory in an enabled state or a disabled state. The BIST circuit includes a control signal generating circuit that generates a control signal for controlling a writing operation and a reading operation of the memory. The memory block circuit includes the multiple memories. The memory block circuit includes an address converting circuit that generates, based on the address signal, an address input signal corresponding to the address of the memory to be tested out of the multiple memories, and generates a memory selection signal for selecting the memory to be tested from the multiple memories. The memory block circuit includes a memory output selecting circuit that selects and outputs data from the memory to be tested out of the multiple memories, based on the memory selection signal.

Hereafter, embodiments of an output circuit according to the present invention will be described with reference to the drawings.

(First Embodiment)

A first embodiment will describe an example in which two SRAM macros having different configurations are combined into a group that can be used as a single memory from a BIST circuit.

Figure 1:
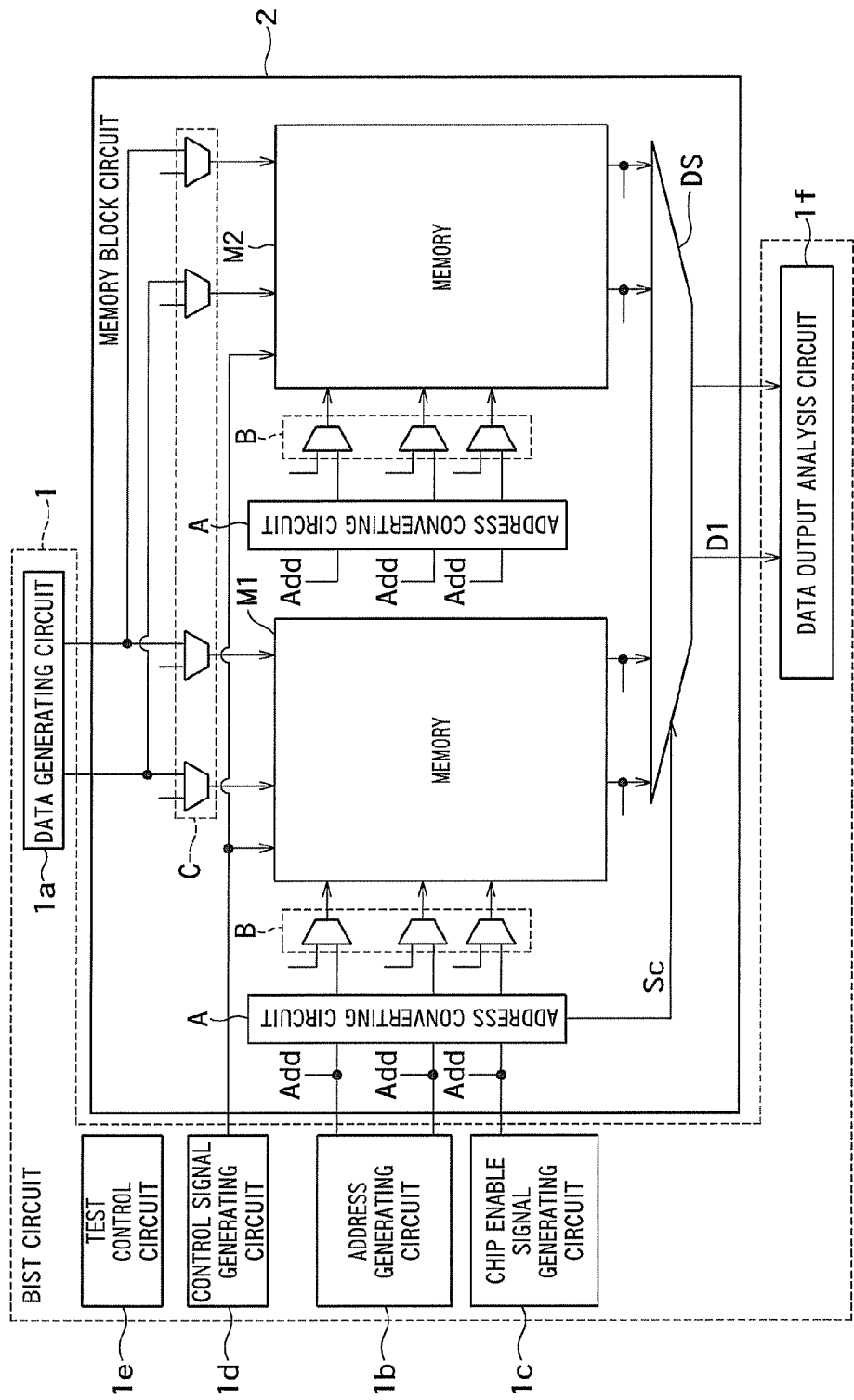
FIG. 1 is a diagram showing an example of the configuration of a semiconductor integrated circuit 100 according to the first embodiment.

FIG. 1 illustrates an example of the configuration of a semiconductor integrated circuit 100 according to the first embodiment. FIG. 1 illustrates, as an example, a memory block circuit including two memories (SRAM macros). The memory block circuit may include more than two memories.

As illustrated in FIG. 1, the semiconductor integrated circuit 100 includes a built-in self-test (BIST) circuit 1 for testing of the memories and a memory block circuit 2.

In the example of FIG. 1, the single BIST circuit conducts a test on the single memory block circuit 2. As will be described later, the BIST circuit 1 may conduct tests on multiple memory block circuits 2 in parallel.

The BIST circuit 1 includes a data generating circuit 1a, an address generating circuit 1b, a chip enable signal generating circuit 1c, a control signal generating circuit 1d, a test control circuit 1e, and a data output analysis circuit 1f.

The address generating circuit 1b generates a series of address signals Add that contain the addresses of memories M1 and M2. A certain range of the series of address signals corresponds to phases for testing the memories M1 and M2.

The data generating circuit 1a generates data to be written into the memories M1 and M2 and expected value data corresponding to the written data.

For example, the data generating circuit 1a generates a data input as data to be shared by the macros. In the case where the memory macros vary in data width, the data generating circuit 1a generates data for the macro having a larger width and inputs a part of the data to the macro having a smaller width.

In the case of testing on multiple memories in parallel, the data generating circuit 1a generates data with a data width corresponding to the sum of the data widths of memory macros to be tested in parallel.

The chip enable signal generating circuit 1c generates a chip enable signal for controlling the memories M1 and M2 in an enabled state or a disabled state.

The control signal generating circuit 1d generates a control signal for controlling a writing operation and a reading operation of the memories M1 and M2.

The data output analysis circuit 1f compares data outputted from the memory block circuit 2 (memory output selecting circuit DS) and the expected value data and analyzes the data.

The test control circuit 1e controls the data generating circuit 1a, the address generating circuit 1b, the chip enable signal generating circuit 1c, the control signal generating circuit 1d, the data output analysis circuit 1f, and the memory block circuit 2 to conduct tests on the memories.

As illustrated in FIG. 1, the memory block circuit 2 includes the memories M1 and M2, address converting circuits A, selecting circuits B and C, and the memory output selecting circuit DS.

The memories M1 and M2 contain multiple memory bits (cell arrays) for storing predetermined data.

The memories M1 and M2 receives the written data, address data (the address input signal), and the control signal. The memories further receive, for example, a write enable signal and a bit mask signal, which are not shown.

The memories M1 and M2 store the written data in response to the written data, the address data, and a control signal for a writing instruction, and further read and output the stored data in response to the address data and a control signal for a reading instruction.

The addresses of the memories include, for example, column addresses in the column direction of the bit cells of the memories, and row addresses in the row direction. In other words, a bit cell in the memory is specified by a row address, a column address, and an I/O bit position.

In the following explanation, the memory may be referred to as "M" for convenience.

The selecting circuits B and C are controlled by the test control circuit 1e. The selecting circuits B and C select a test signal side (the output side of the BIST circuit 1) to output a signal during testing (when a BIST execution mode is selected). Normally, the selecting circuits B and C select a system signal side from an external system to output a signal.

The address converting circuit A generates the address input signal corresponding to the address of the test target memory of the memories M1 and M2, from the address signal Add. Specifically, the address converting circuit A determines a memory macro currently placed in a test phase from the address signal Add generated by the address generating circuit 1b, and outputs the address signal for the memory.

Furthermore, the address converting circuit A generates a memory selection signal Sc for selecting a test target memory from the memories M1 and M2.

The address converting circuit A optionally performs conversion for minimizing the range of the address signals Add generated by the address generating circuit 1b. For example, an offset is provided for the address signal Add.

The memory output selecting circuit DS selects and outputs data from the test target memory (currently tested memory) of the memories M1 and M2 based on the memory selection signal Sc.

The bit width of the memory output selecting circuit DS is set, for example, at the largest data width of the memory macros to be tested.

As described above, the data output analysis circuit 1f analyzes data outputted from the memory output selecting circuit DS.

As has been discussed, during testing, the memories having different configurations are combined in the memory block circuit and thus can be handled like a single memory. Needless to say, the different memories act as independent memories in a system operation.

The following will describe an example of an operation during testing on the semiconductor integrated circuit 100 configured thus.

For example, in a test phase of the memory M1, the chip enable signal places the memory M1 in an enabled state and an address is provided for the memory M1. Then, writing and reading operations are performed on the cell array of the memory M1.

Specifically, of the memories M1 and M2, data is written into the cell array of the memory M1 that is enabled by the chip enable signal and corresponds to the address input signal.

Moreover, of the memories M1 and M2, data stored in the cell array of the memory M1 is read that is enabled by the chip enable signal and corresponds to the address input signal.

The memory output selecting circuit DS selects and outputs the data read from the memory M1, based on the memory selection signal Sc.

In the test phase of the memory M1, the memory M2 is fixed in a disabled state by the chip enable signal, so that a writing or reading operation is not performed on the cell array of the memory M2.

In other words, of the memories M1 and M2, a writing or reading operation is not performed on the cell array of the memory M2 that is disabled by the chip enable signal.

In the case of testing on multiple memories in parallel, for example, the memories M1 and M2 are enabled by the chip enable signal in the test phase of the memories M1 and M2 and addresses are provided for the memories M1 and M2. Then, writing and reading operations are performed on the cell arrays of the memories M1 and M2.

Figure 2:
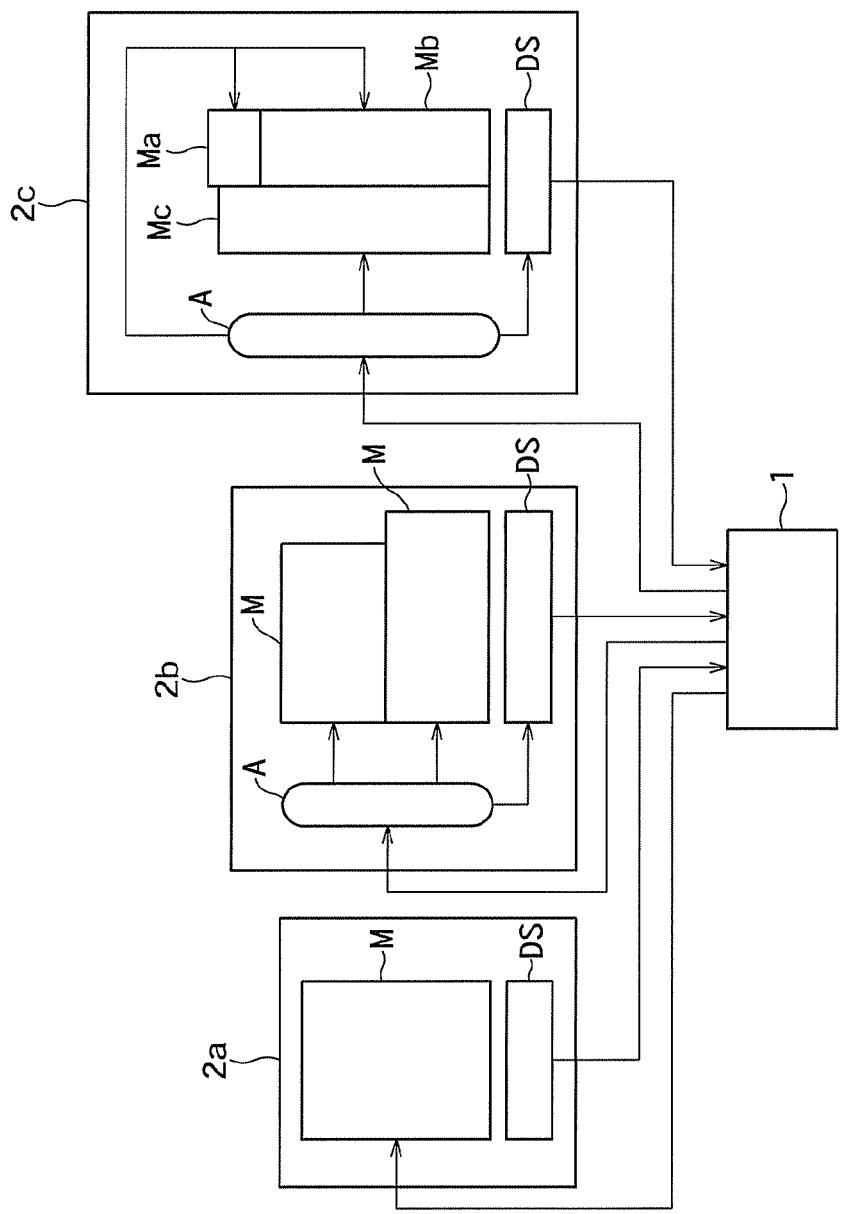
FIG. 2 is a block diagram of an example in which the BIST circuit 1 of FIG. 1 conducts tests on memory block circuits 2a, 2b, and 2c in parallel.
Figure 3:
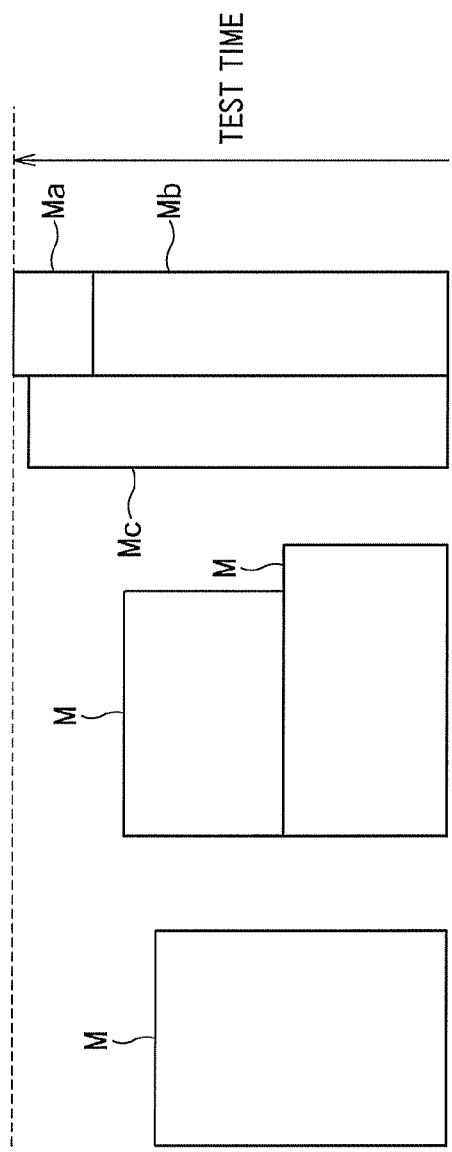
FIG. 3 is a conceptual diagram showing the relationship between the block memories of FIG. 2 and a testing time.

FIG. 2 is a block diagram of an example in which the BIST circuit 1 of FIG. 1 conducts tests on memory block circuits 2a, 2b, and 2c in parallel. FIG. 3 is a conceptual diagram showing the relationship between the block memories of FIG. 2 and a testing time. In FIG. 2, the selecting circuits B and C of FIG. 1 are omitted for simplicity.

As illustrated in FIG. 2, the BIST circuit 1 conducts tests on the memory block circuits 2a, 2b, and 2c in parallel. The memories are grouped into blocks by the memory block circuits 2a, 2b, and 2c and are sequentially tested in the memory block circuits.

For example, the memories Ma and Mb of the memory block circuit 2c are tested in serial, and the memories Ma (Mb) and Mc of the memory block circuit 2c are tested in parallel. Therefore, in the case of testing on multiple memories Ma, Mb, and Mc of the memory block circuit 2c as a single memory, the bit width of the memory output selecting circuit DS is set at the sum of the data widths of the memories Ma (Mb) and Mc to be tested in parallel.

As described above, the memory block circuits can be tested in parallel, achieving a shorter testing time than in the case where the memories are sequentially tested (FIG. 3). Particularly, for the memories tested by the single BIST circuit, an optimum combination of the test circuit and a testing time can be selected.

As described above, the semiconductor integrated circuit of the present embodiment can shorten a testing time while suppressing an increase in circuit size.

(Second Embodiment)

A second embodiment will describe a structural example in which a memory block circuit for multiple (n) memories M1 to Mn includes a memory fault detection circuit and a repair analysis circuit (or a failure diagnosis circuit).

Figure 4:
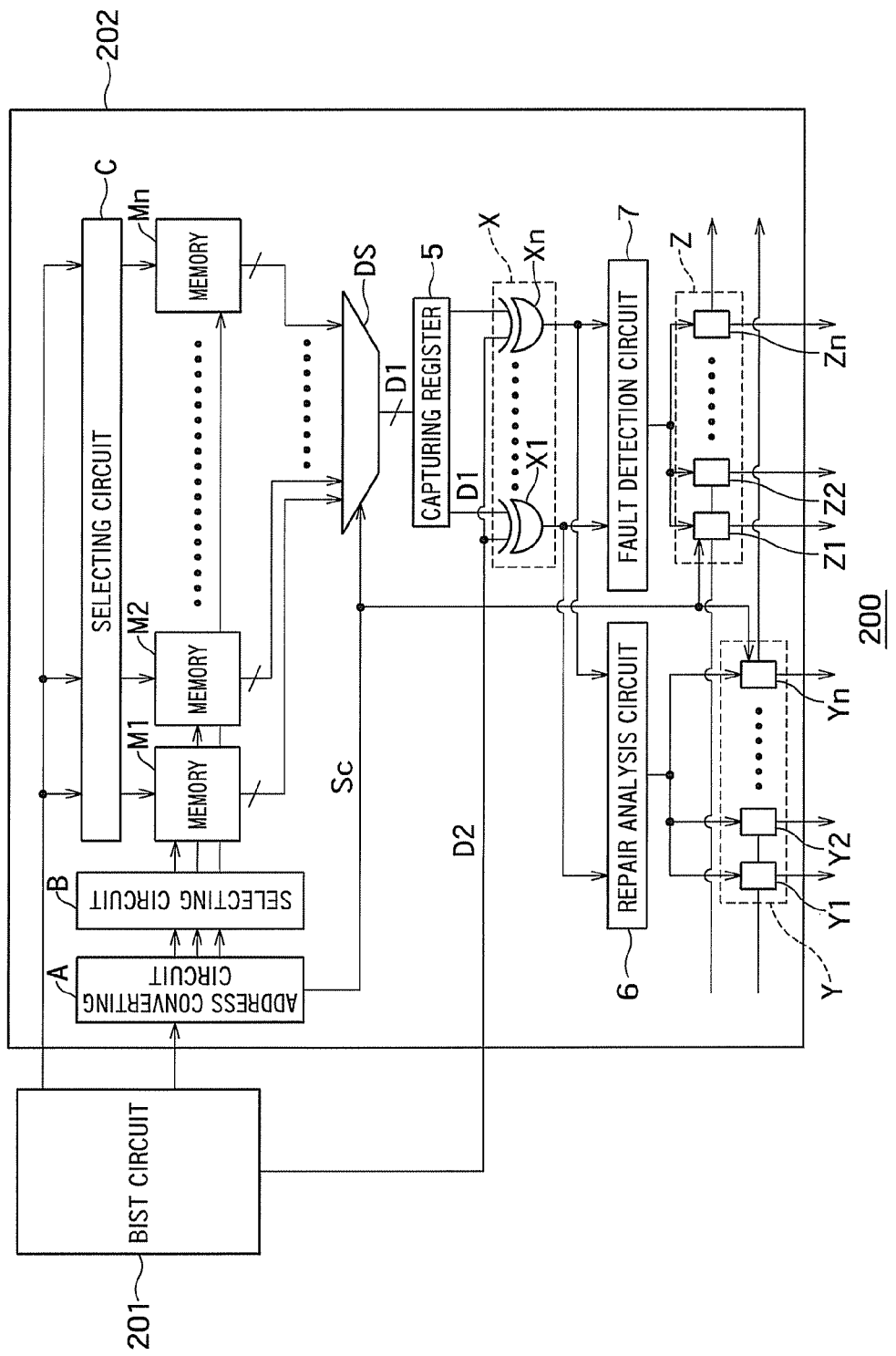
FIG. 4 is a diagram showing an example of the configuration of a semiconductor integrated circuit 200 according to the second embodiment.
Figure 5:
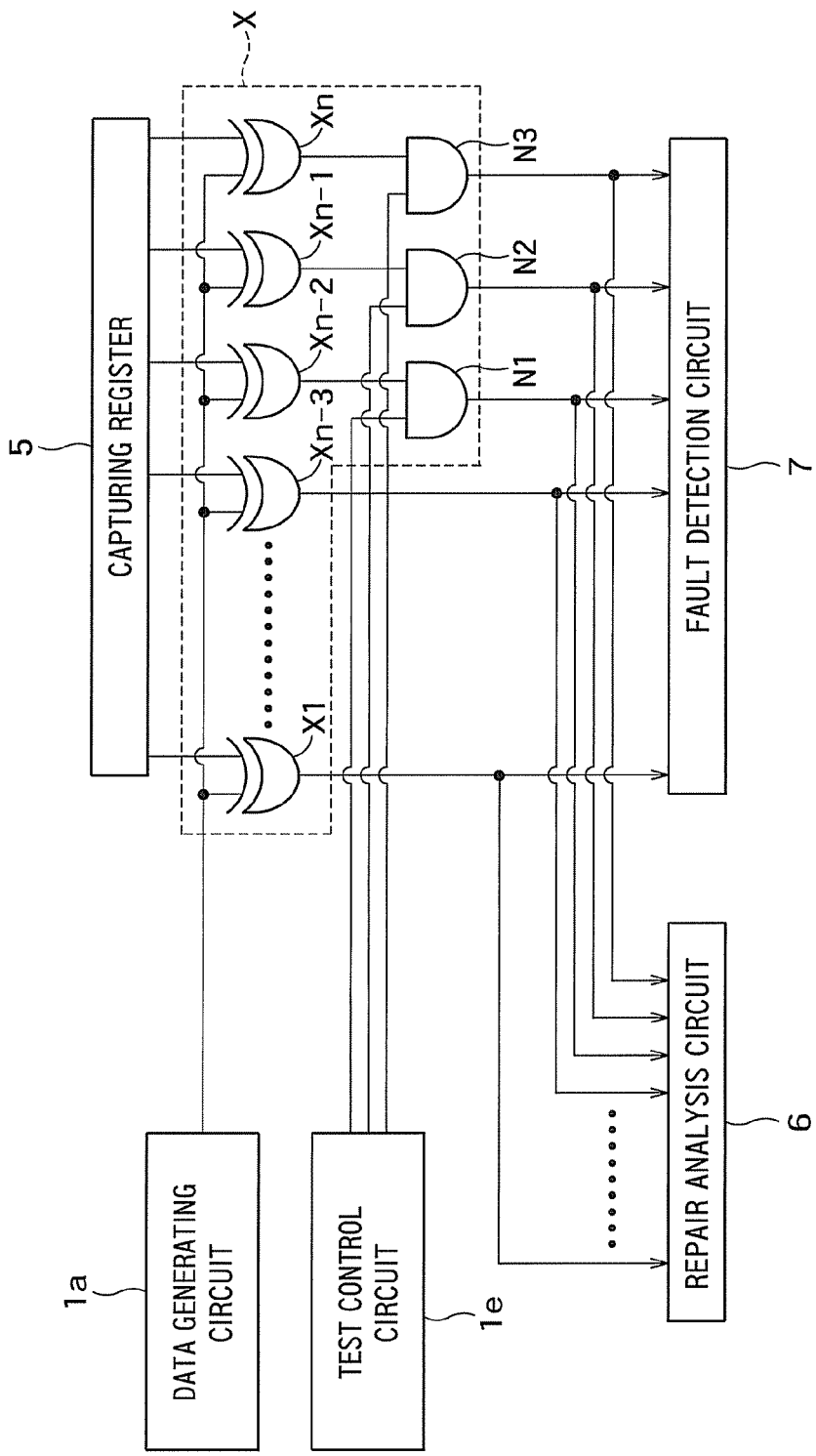
FIG. 5 is a modification of the configuration of the semiconductor integrated circuit 200 illustrated in FIG. 4.

FIG. 4 illustrates an example of the configuration of a semiconductor integrated circuit 200 according to the second embodiment. In FIGS. 4 and 5, the same reference numerals as in FIG. 1 indicate the same configurations as in the first embodiment.

As illustrated in FIG. 4, the semiconductor integrated circuit 200 includes a BIST circuit 201 for testing of the memories, and a memory block circuit 202.

The BIST circuit 201 is identical in configuration to the BIST circuit 1 of the first embodiment except that the data output analysis circuit if is omitted.

The memory block circuit 202 includes, as in the first embodiment, the multiple (n) memories M1 to Mn, an address converting circuit A, selecting circuits B and C, and a memory output selecting circuit DS.

The memory block circuit 202 further includes, unlike in the first embodiment, a capturing register 5, a repair analysis circuit 6, a fault detection circuit 7, a bit comparator circuit X, a repair analysis result register Y, and a fail flag register Z.

The capturing register 5 holds output data D1 from the memory output selecting circuit DS and then outputs the data.

The bit width of the capturing register 5 is set at, for example, the maximum bit width of the memories to be tested, like the bit width of the memory output selecting circuit DS.

The bit comparator circuit X outputs a comparison result (failure information) between the output data D1 and the expected value data D2 for each bit to the fault detection circuit 7 and the repair analysis circuit 6.

The bit comparator circuit X is shared by the multiple (n) memories M1 to Mn. The bit comparator circuit X includes multiple (n) XOR elements X1 to Xn that receive the output data D1 and the expected value data D2 and output the comparison result.

The fault detection circuit 7 determines presence or absence of memory defects based on the comparison result and then outputs a fail flag as a result.

The fail flag register Z includes multiple (n) first storages (registers) Z1 to Zn that are connected to the output of the fault detection circuit 7 and are provided for the respective (n) memories M1 to Mn.

The fail flag register Z stores a fault detection result of a memory to be tested (e.g., the memory M1) in the first storage (e.g., the first storage Z1) corresponding to the memory to be tested (e.g., the memory M1), based on a memory selection signal Sc.

Moreover, the fail flag register Z updates a result only in the first storage corresponding to a memory instance to be currently tested, in response to the memory selection signal Sc.

The repair analysis circuit 6 analyzes the possibility of repair of a defective memory based on the comparison result, and then generates and outputs a repair analysis result. Specifically, the repair analysis circuit 6 decides whether the memory to be currently tested can be repaired or not based on failure information for each bit of the memory. In the case where the memory can be repaired, repair solution data is generated and outputted.

The repair analysis result register Y includes multiple (n) second storages (registers) Y1 to Yn that are connected to the output of the repair analysis circuit 6 and are provided for the respective memories M1 to Mn.

The repair analysis result register Y stores a repair analysis result of the memory to be tested (e.g., the memory M1) in the second storage (e.g., the second storage Y1) corresponding to the memory to be tested (e.g., the memory M1), based on the memory selection signal Sc.

Specifically, the repair analysis result register Y updates a result only in the second storage corresponding to a memory instance to be currently tested, in response to the memory selection signal Sc.

The repair analysis circuit 6 may be configured to act as a failure diagnosis circuit. In this case, a failed bit can be specified or a failure type can be determined for each memory macro entity during testing on the memories M1 to Mn. In this case, the repair analysis result register Y stores the diagnosis result of the memory to be tested.

The memory block circuit 202 outputs the fault detection result stored in the fail flag register Z and the repair analysis result stored in the repair analysis result register, to the outside serially and in parallel.

The following will describe an example of the operations of the semiconductor integrated circuit 200 configured thus. Of the operations of the semiconductor integrated circuit 200, the operations of the same configurations as in the first embodiment are similar to those of the first embodiment.

First, as described in the first embodiment, the capturing register 5 holds the output data D1 outputted from the memory output selecting circuit DS and then outputs the data.

Then, the bit comparator circuit X outputs a comparison result (failure information) between the output data D1 and the expected value data D2 for each bit to the fault detection circuit 7 and the repair analysis circuit 6.

The fault detection circuit 7 determines presence of absence of memory defects based on the comparison result and outputs a determination result.

The fail flag register Z updates a result only in the first storage corresponding to a memory instance to be currently tested, in response to the memory selection signal Sc.

The repair analysis circuit 6 decides whether the memory to be currently tested can be repaired or not based on the failure information for each bit of the memory. If the memory can be repaired, the repair solution data of the memory is generated and outputted.

Then, the repair analysis result register Y updates a result only in the second storage corresponding to a memory instance to be currently tested, in response to the memory selection signal Sc.

At the completion of testing on all memory instances, the fault detection result and the repair analysis result are stored in the fail flag register Z and the repair analysis result register Y, respectively.

Thus, the results are outputted in parallel or serially to a testing apparatus (not shown) outside the semiconductor integrated circuit 200 and then are used for the subsequent steps.

In the case where the memory to be tested is not varied in bit width in all instances, the bit width of the capturing register 5 is preferably set at the bit width of the memory.

If the bit width varies in each instance, the bit width of the capturing register 5 needs to be set at least according to the memory having the maximum bit width. During testing on the memory having a smaller bit width than the maximum bit width, the higher bits of the memory output selecting circuit DS are not necessary and thus the bit width is fixed at "0" (indicating the absence of a memory failure). At this point, the higher bits of the capturing register 5 captures the value of "0". Moreover, "1" indicates the presence of a memory failure.

In the case where the expected value data D2 is generated according to the maximum bit width, an XOR operation result on the expected value data D2 and an unnecessary higher bit is not required for failure detection in a test.

FIG. 5 illustrates a modification of the configuration of the semiconductor integrated circuit 200 illustrated in FIG. 4. In FIG. 5, the configurations of FIG. 4 are illustrated from the capturing register 5 to the repair analysis circuit 6 and the fault detection circuit 7.

As illustrated in FIG. 5, the bit comparator circuit X further includes XOR elements Xn-2 to Xn of multiple (n) XOR elements X1 to Xn, and AND elements N1 to N3 that are provided between the XOR elements Xn-2 to Xn and the repair analysis circuit 6 and the fault detection circuit 7.

The AND elements N1 to N3 receive comparison results outputted from the respective XOR elements Xn-2 to Xn and the control signal outputted from a test control circuit 1e of the BIST circuit 201. The outputs of the AND elements N1 to N3 are connected to the repair analysis circuit 6 and the fault detection circuit 7.

As illustrated in FIG. 5, the AND elements N1 to N3 can fix the comparison result at "0" (indicating the absence of a memory failure) in response to the control signal.

A data generating circuit 1a may generate the expected value data D2 so as to fix the unnecessary higher bit at "0".

This configuration can eliminate unnecessary fault detection in a test.

The memory block circuit and other configurations and functions of the semiconductor integrated circuit 200 are similar to those of the semiconductor integrated circuit 100 of the first embodiment.

According to the second embodiment, the repair analysis circuit can be provided for the memories M1 to Mn along with the bit comparator circuit. Thus, it is possible to perform fault detection by testing, repair analysis, failure diagnosis, and so on while considerably suppressing a size increase of a logic circuit with an additional test circuit.

In this case, a fault detection flag and repair information (or failure diagnosis information) in a test are provided for each memory instance as in the conventional configuration having a one-to-one correspondence with a memory. Thus, the test, the failure diagnosis, and the accuracy and efficiency of repair are not degraded.

As described above, the semiconductor integrated circuit of the present embodiment can shorten a testing time while suppressing an increase in circuit size.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a built-in self-test circuit configured to conduct a test on memory; and
a memory block comprising a plurality of memories, the built-in self-test circuit comprising:
an address generator configured to generate an address signal comprising an address of memory;
a data generator configured to generate data to be written to memory and expected value data corresponding to the data to be written;
a chip enable signal generator configured to generate a chip enable signal for controlling memory; and
a control signal generator configured to generate a control signal for controlling a writing operation and a reading operation of memory,
the memory block comprising:
the plurality of memories;
an address converter configured to generate, based on the address signal, an address input signal corresponding to an address of a memory to be tested of the plurality of memories, and configured to generate a memory selection signal for selecting the memory to be tested; and
a memory output selector configured to select and output data from the memory to be tested based on the memory selection signal.

2. The semiconductor integrated circuit of claim 1, wherein the memory block comprises:
a bit comparator configured to output a comparison result for each bit between the output data from the memory output selector and the expected value data;
a fault detector configured to determine a presence or an absence of memory defects based on the comparison result and output a determination result; and
a fail flag register comprising first storages connected to an output of the fault detector and corresponding to memories, the fail flag register configured to store a fault detection result in a first storage corresponding to the memory to be tested.

3. The semiconductor integrated circuit of claim 1, wherein the memory block comprises:
a repair analyzer configured to analyze a possibility of repair of a defective memory based on a comparison result and to generate and output a repair analysis result; and
a repair analysis result register comprising second storages connected to an output of the repair analyzer and corresponding to memories, the repair analysis result register configured to store a repair analysis result in a second storage corresponding to the memory to be tested.

4. The semiconductor integrated circuit of claim 2, wherein the memory block comprises:
a repair analyzer configured to analyze a possibility of repair of a defective memory based on the comparison result and to generate and output a repair analysis result; and
a repair analysis result register comprising second storages connected to an output of the repair analyzer and corresponding to memories, the repair analysis result register configured to store a repair analysis result in a second storage corresponding to the memory to be tested.

5. The semiconductor integrated circuit of claim 2, wherein the fault detection result stored in the fail flag register is outputted.

6. The semiconductor integrated circuit of claim 3, wherein the repair analysis result stored in the repair analysis result register is outputted.

7. The semiconductor integrated circuit of claim 4, wherein the repair analysis result stored in the repair analysis result register is outputted.

8. The semiconductor integrated circuit of claim 2, wherein the bit comparator comprises a plurality of XOR elements configured to receive the output data and the expected value data and output the comparison result.

9. The semiconductor integrated circuit of claim 4, wherein the bit comparator comprises a plurality of XOR elements configured to receive the output data and the expected value data and output the comparison result.

10. The semiconductor integrated circuit of claim 5, wherein the bit comparator comprises a plurality of XOR elements configured to receive the output data and the expected value data and output the comparison result.

11. A semiconductor integrated circuit comprising:
a built-in self-test circuit configured to conduct a test on memory; and
multiple memory blocks comprising a plurality of memories,
the built-in self-test circuit comprising:
an address generator configured to generate an address signal comprising an address of memory;

a data generator configured to generate data to be written to memory and expected value data corresponding to the data to be written;

a chip enable signal generator configured to generate a chip enable signal for controlling memory; and a control signal generator configured to generate a control signal for controlling a writing operation and a reading operation of memory, the multiple memory blocks comprising:

the plurality of memories;

an address convertor configured to generate, based on the address signal, an address input signal corresponding to an address of a memory to be tested of the plurality of memories, and configured to generate a memory selection signal for selecting the memory to be tested; and a memory output selector configured to select and output data from the memory to be tested based on the memory selection signal, wherein the built-in self-test circuit is configured to conduct tests on the multiple memory blocks in parallel.

12. The semiconductor integrated circuit of claim 11, wherein the multiple memory blocks comprise:

a bit comparator configured to output a comparison result for each bit between the output data from the memory output selector and the expected value data;

a fault detector configured to determine a presence or an absence of memory defects based on the comparison result and output a determination result; and a fail flag register comprising first storages connected to an output of the fault detector and corresponding to memories, the fail flag register configured to store a fault detection result in a first storage corresponding to the memory to be tested.

13. The semiconductor integrated circuit of claim 11, wherein the multiple memory blocks comprise:

a repair analyzer configured to analyze a possibility of repair of a defective memory based on a comparison result and to generate and output a repair analysis result; and a repair analysis result register comprising second storages connected to an output of the repair analyzer and corresponding to memories, the repair analysis result register configured to store a repair analysis result in a second storage corresponding to the memory to be tested.

14. The semiconductor integrated circuit according to claim 12, wherein the multiple memory blocks comprise:

a repair analyzer configured to analyze a possibility of repair of a defective memory based on the comparison results and to generate and output a repair analysis result; and a repair analysis result register comprising second storages connected to an output of the repair analyzer and corresponding to memories, the repair analysis result register configured to store a repair analysis result in a second storage corresponding to the memory to be tested.

15. The semiconductor integrated circuit of claim 12, wherein the fault detection result stored in the fail flag register is outputted.

16. The semiconductor integrated circuit of claim 13, wherein the repair analysis result stored in the repair analysis result register is outputted.

17. The semiconductor integrated circuit of claim 14, wherein the repair analysis result stored in the repair analysis result register is outputted.

18. The semiconductor integrated circuit of claim 12, wherein the bit comparator comprises a plurality of XOR elements configured to receive the output data and the expected value data and output the comparison result.

19. The semiconductor integrated circuit of claim 14, wherein the bit comparator comprises a plurality of XOR elements configured to receive the output data and the expected value data and output the comparison result.

20. The semiconductor integrated circuit of claim 11, further comprising a data output analyzer configured to analyze data outputted from the memory output selector.

* * * * *